(12) United States Patent
Jessenig

(10) Patent No.: US 8,542,057 B2
(45) Date of Patent: Sep. 24, 2013

(54) CIRCUIT ARRANGEMENT AND METHOD FOR TEMPERATURE MEASUREMENT

(75) Inventor: Thomas Jessenig, Graz (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 13/306,898

(22) Filed: Nov. 29, 2011

(65) Prior Publication Data
US 2012/0146709 A1 Jun. 14, 2012

Related U.S. Application Data

(63) Continuation of application No. PCT/EP2010/056119, filed on May 5, 2010.

(30) Foreign Application Priority Data

May 29, 2009 (DE) .......................... 10 2009 023 354

(51) Int. Cl.
*H01L 35/00* (2006.01)
(52) U.S. Cl.
USPC .......................................... 327/512
(58) Field of Classification Search
USPC .................................. 327/512, 513
See application file for complete search history.

(56) References Cited

U.S. PATENT DOCUMENTS

| | | | |
|---|---|---|---|
| 4,209,774 A * | 6/1980 | Bendler | 341/119 |
| 5,504,416 A * | 4/1996 | Holloway et al. | 320/152 |
| 7,451,053 B2 * | 11/2008 | Jeong | 702/99 |
| 7,880,528 B2 * | 2/2011 | Igarashi | 327/512 |
| 7,953,569 B2 * | 5/2011 | Jeong | 702/99 |
| 7,965,571 B2 * | 6/2011 | Jeong et al. | 365/222 |
| 8,044,702 B2 * | 10/2011 | Niederberger | 327/513 |
| 2003/0086476 A1 | 5/2003 | Mizuta | |
| 2008/0043810 A1 | 2/2008 | Vogt et al. | |
| 2008/0198899 A1 | 8/2008 | Igarashi | |

FOREIGN PATENT DOCUMENTS

| | | |
|---|---|---|
| DE | 196 40 383 | 4/1998 |
| EP | 2 056 083 | 5/2009 |
| GB | 1 542 593 | 3/1979 |

OTHER PUBLICATIONS

Linear Technoogy Corporation, "LTC3555/LTC3555-X—High Efficiency USB Power Manager + Triple Step-Down DC/DC" 2007, pp. 1.32.

Linear Technology Corporation, "LTC4090/LTC4090-5—USB Power Manager with 2A High Voltage Bat-Track Buck Regulator" 2007, pp. 1-28.

\* cited by examiner

*Primary Examiner* — Jeffrey Zweizig
(74) *Attorney, Agent, or Firm* — McDermott Will & Emery LLP

(57) ABSTRACT

A circuit arrangement for temperature measurement comprises an input for connecting a temperature-sensitive element, a that is connected to a first input of a comparator. A reference voltage is connected to a second input of the comparator. Furthermore, the arrangement comprises a sequential logic, that is coupled to the output of the comparator that comprises a first output and a second output. A digitally controllable switch element for providing a superposition signal is connected to the output of the sequential logic and the first input of the comparator.

14 Claims, 4 Drawing Sheets

CIRCUIT ARRANGEMENT AND METHOD FOR TEMPERATURE MEASUREMENT

RELATED APPLICATIONS

This application is a continuation application under 37 C.F.R. 1.53(b) of pending International Application No. PCT/EP2010/056119 filed May 5, 2010, the entire content of which is hereby incorporated by reference.

FIELD OF THE INVENTION

The present invention relates to a circuit arrangement and a method for temperature measurement.

BACKGROUND OF THE INVENTION

Temperature monitoring, and therefore temperature measurement, during a charging process is a frequent requirement for battery charging devices. This is so that excessively high or excessively low temperatures can be avoided, which is a necessary condition for destruction-free charging for a number of battery types such as lithium-ion rechargeable batteries.

Methods for precise temperature measurement are often based on the use of semiconductor temperature sensors. Thermistors, especially NTC resistors, i.e., thermistors with negative temperature coefficients, are generally used and make it possible to measure the temperature as a function of a variable resistance. These switching elements are frequently already installed in batteries.

A disadvantage of using thermistors is the occurrence of large differences of resistance within the temperature limits that are critical for battery-charging processes, which temperature limits lie between 0° C. and 50° C. for lithium ion batteries. There is a difference of as much as 10 k$\Omega$ in the resistances of a thermistor within such an interval. Simple constant current circuits or resistive voltage dividers are therefore usually not suitable for a precise temperature measurement. One solution to this problem is to use several voltage comparators, connected as window comparators, for example, that correspond to the temperature interval for the measurement. Offset errors in the voltages that are present at the comparators and that are dependent on the charging current of the battery, as well as any loads attached, are a disadvantage of such an implementation. This consequently complicates an exact temperature measurement.

SUMMARY OF THE INVENTION

An object of the present invention is to provide a circuit arrangement and a method for temperature measurement that reduces the influence of offset errors.

In one embodiment, a circuit arrangement for temperature measurement comprises an input, connected to a first input of a comparator, for connecting a temperature-sensitive element. A second input of the comparator is connected to a reference voltage. One output of the comparator is coupled to a sequential logic unit that comprises an output for temperature measurement. Another output of the sequential logic unit is connected to a digitally controllable switching element for providing a superposition signal, which is in turn coupled to the first input of the comparator.

A measurement signal dependent on the temperature is supplied to the comparator by the connected temperature-sensitive element in such a manner that a temperature-dependent measurement voltage is present at the first input of the comparator and a reference voltage is present at the second input of the comparator. Thus a signal dependent on a comparison of the temperature-dependent measurement voltage and the reference voltage is provided at the output of the comparator and is fed to the sequential logic unit. As a function of this comparison, the sequential logic unit iteratively provides a first output signal at a first output and a second output signal at a second output. In each iteration step, the first output signal is fed to the digitally controllable element for providing a superposition signal and is superimposed by the temperature-dependent measurement signal. The temperature-dependent measurement voltage thus formed is coupled to the first input of the comparators and again compared to the reference voltage. The iterative repetition of comparing and superimposing continues until an end condition is achieved.

The use of only one comparator for determining the temperature, especially the temperature of a battery, is advantageously made possible by means of the sequential logic unit and the iterative superposition and comparison. It is thus advantageously possible to use high voltages at the comparator and thereby reduce the influence of offset voltages on the temperature measurement. According to the invention, the circuit arrangement requires only one input for temperature measurement.

In a refinement of the circuit arrangement for temperature measurement, the digitally controllable switching element comprises a digitally controllable current source for providing a superposition signal. A controllable reference voltage is also present at the second input of the comparator.

The digitally controllable current source superimposes a current with the temperature-dependent measurement signal, preferably also a current, so that the temperature-dependent measurement voltage is present at the first input of the comparator and is compared with the reference voltage present at the second input of the comparator and controllable reference voltage.

Due to the controllable reference voltage, the comparison can advantageously be modified, particularly during the operation of the circuit arrangement, and thus a comparison temperature can be selected as a function of the reference voltage.

In a refinement of the circuit arrangement for temperature measurement, the sequential logic unit and the comparator form an analog-to-digital converter. The digitally controllable switching element for providing a superposition signal also comprises a digital-analog converter.

By means of the comparator and the sequential logic unit, the analog-digital converter converts the comparison-dependent analog signal into a digital signal. With each iteration step the digital-analog converter translates the digital first output signal of the sequential logic unit into an analog signal that is coupled as a superposition signal to the first input of the comparator and from which in particular a temperature can be derived after suitable calibration.

In a refinement of the circuit arrangement for temperature measurement, a converter for successive approximation comprises the sequential logic unit and the comparator, wherein the sequential logic unit comprises a shift register for successive approximation.

By using the converter for successive approximation, the signal dependent on the comparison is translated in an approximative manner for successive approximation into a digital signal by means of the comparator and the shift register. Subsequently, the superposition signal changes with each iteration in such a manner that the measurement voltage dependent on the temperature at the first input of the comparator and the reference voltage at the second input of the comparator are as close to equal as possible. Especially if the temperature-sensitive element is a thermistor, its resistance can be formed to a good approximation from the ratio of the reference voltage and the measurement signal, especially a current, dependent on the temperature. The resulting resistance value can be translated into a temperature by suitable calibration.

Alternatively, other methods for analog-digital conversion, an up/down counter in particular, can be used for successive approximation instead of the shift register.

In a refinement of the circuit arrangement for temperature measurement, the digitally controllable switching element for providing a superposition signal comprises a first current source that can be connected via a first digitally controllable switch to the first input of the comparator, as well as a second current source that can be connected via a second digitally controllable switch to the first input of the comparator. The sequential logic unit comprises a first flip-flop with a first data input and a second flip-flop with a second data input, each connected to the output of the comparator. The second output of the sequential logic unit comprises a first output of the first flip-flop and a second output of the second flip-flop. The sequential logic unit further comprises a clock generator that is connected to a first clock input of the first flip-flop and a second clock input of the second flip-flop. The clock generator generates a first and a second clock signal in a periodic sequence. In a first clock phase, the first digitally controllable switch closes with the first clock signal from the clock generator and the second digitally controllable switch is opened, so that only the first current source is electrically connected to the first input of the comparator. In a subsequent second clock phase, the second digitally controllable switch closes with the second clock signal from the clock generator and the first digitally controllable switch is opened, so that only the second current source is electrically connected to the first input of the comparator. The signal dependent on the comparison is transferred with each clock signal from the clock generator to the first data input of the first flip-flop and the second data input of the second flip-flop, and the second output signal of the sequential logic unit is provided at the first output of the first flip-flop and the second output of the second flip-flop.

A temperature interval with an upper and lower temperature limit can advantageously be defined with the first current source and the second current source. The comparison with two different temperature-dependent measurement voltages, corresponding to the two different temperature limits takes place at the comparator with the aid of the clock generator. In particular, it can be measured in this manner, preferably during a battery-charging cycle, whether the temperature of the battery lies within a defined temperature range.

In a refinement of the circuit arrangement for temperature measurement, the clock generator comprises a pulse generator and an inverter.

The first clock input of the first flip-flop or the second clock input of the second flip-flop is set with a pulse from the pulse generator, with one clock input always being set and the other clock input reset by the inverter.

The first clock signal from the clock generator and the second clock signal from the clock generator can advantageously be combined into one clock signal due to the combination of clock generator and inverter.

In a refinement of the circuit arrangement for temperature measurement, the clock generator comprises a signal generator.

The signal generator generates the first clock signal and the second clock signal in such a manner that the two clock signals do not overlap.

In one embodiment, an arrangement for temperature measurement comprises a circuit arrangement for temperature measurement and a battery with a temperature-sensitive element.

The battery has a temperature, particularly during a charging cycle, and supplies a temperature-dependent measurement signal via the temperature-sensitive element, preferably a thermistor, to the circuit arrangement for temperature measurement. The temperature is measured by the circuit arrangement for temperature measurement.

In one embodiment, the method for temperature measurement comprises supplying a signal dependent on the temperature, a comparison of a temperature-dependent measurement voltage to a reference voltage, a superimposition of the signal dependent on the temperature with a signal dependent on the comparison, as well as a provision of a temperature-dependent measurement voltage and a provision of the signal dependent on the comparison.

The supply of a signal dependent on the temperature leads to a temperature-dependent measurement voltage, which is compared to a reference voltage. The temperature-dependent measurement voltage can lie above or below the reference voltage. Subsequently, a signal dependent on the comparison is generated and superposed iteratively on the temperature-dependent signal until an end condition is reached and the signal dependent on the comparison is provided.

By means of the iterative repetition of comparing and superposing the temperature, the temperature, particularly that of a battery, is advantageously measured up to an end condition. In particular, the end condition can be defined by covering a desired temperature interval or by achieving a desired measurement precision.

In a refinement, the method for temperature measurement comprises an adjustable reference voltage.

The reference voltage can advantageously be adjusted, especially while the method for temperature measurement is running, and a reference temperature can be selected in this way.

In a refinement, the method for temperature measurement comprises a first comparison signal and a first measurement voltage dependent thereon, as well as a second comparison signal and a second measurement voltage dependent thereon.

The first comparison signal corresponds to a first temperature limit and the second comparison signal corresponds to a second temperature limit. In a first iteration, the first measurement voltage is compared to the reference voltage and it is thus determined whether it is higher or lower than the reference voltage. In particular, it is determined in this way whether the temperature, preferably that of a battery, is above or below the first temperature limit. In a second iteration, the second comparison signal is compared to the reference voltage and it is thus determined whether it is higher or lower than the reference voltage. In particular, it is determined in this way whether the temperature, preferably that of a battery, is above or below the second temperature limit.

It is advantageously possible to define a temperature interval in this way by two iterations, and in particular, to determine whether the temperature remains within desired temperature limits in a charging process for a battery.

In a refinement, the method for temperature measurement comprises an approximation of the signal dependent on the comparison.

The signal dependent on the comparison is approximated with every iteration step and superimposed on the signal dependent on the temperature in such a manner that the temperature-dependent measurement voltage approaches the reference voltage until the difference between the two signals reaches approximately zero.

The temperature, particularly that of a battery, can advantageously be approximated iteratively and determined as a function of the reference voltage and the superposition signal.

BRIEF DESCRIPTION OF THE DRAWINGS

The invention will be described in detail below for several exemplary embodiments with reference to the figures. Insofar as circuit parts or components correspond to one another in function, a description of them will not be repeated in each of the following figures.

Therein.

DETAILED DESCRIPTION OF THE DRAWINGS

Figure 1:
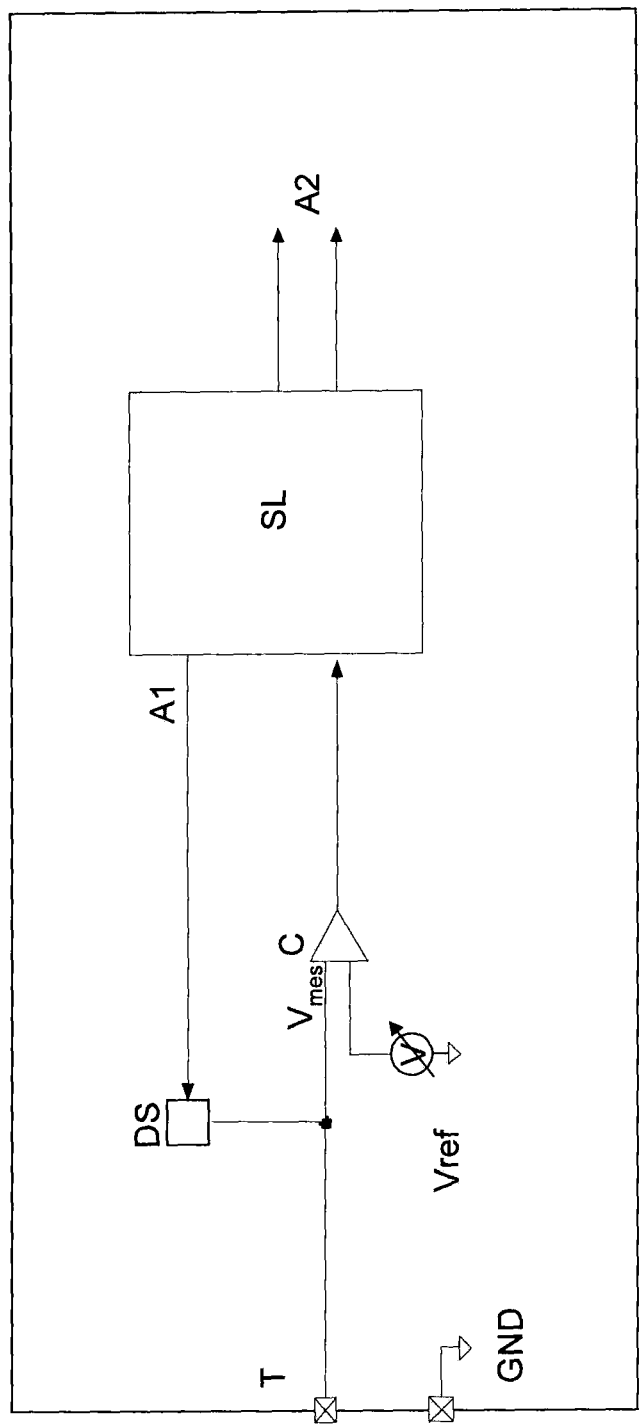
FIG. 1 shows an exemplary embodiment of a circuit arrangement for temperature measurement according to the invention.

FIG. 1 shows an exemplary embodiment of a circuit arrangement for temperature measurement according to the invention, wherein the circuit arrangement comprises an input for connecting a temperature-sensitive element T that is connected to a first input of a comparator C. A second input of the comparator C is connected to a reference voltage Vref. One output of the comparator C is coupled to a sequential logic unit SL that comprises a first output A1 and a second output A2. The output A1 of the sequential logic unit SL is connected to a digitally controllable switching element DS for providing a superposition signal, which is in turn coupled to the first input of the comparator C. The use of a double arrow for output A2 is to represent a digital output signal.

If the circuit arrangement is fed a measurement signal dependent on the temperature by means of a temperature-sensitive element T, then a temperature-dependent measurement voltage Vmes is present at the first input of the comparator C. A reference voltage Vref is provided at the second input of the comparator C. By comparing the temperature-dependent measurement voltage Vmes and the reference voltage Vref by means of the comparator C, a comparison-dependent signal that is supplied to the sequential logic unit SL is present at the output of the comparator C. The sequential logic unit SL then provides a first output signal at the output A1 of the sequential logic unit SL and a second output signal A2 at the second output of the sequential logic unit SL. The second output signal is supplied in an iterative manner to the digitally controllable current source DC and coupled back to the first input of the comparator C.

The use of only one comparator C for determining the temperature is advantageously made possible by means of the sequential logic unit SL and the iterative superposition and comparison.

Figure 2:
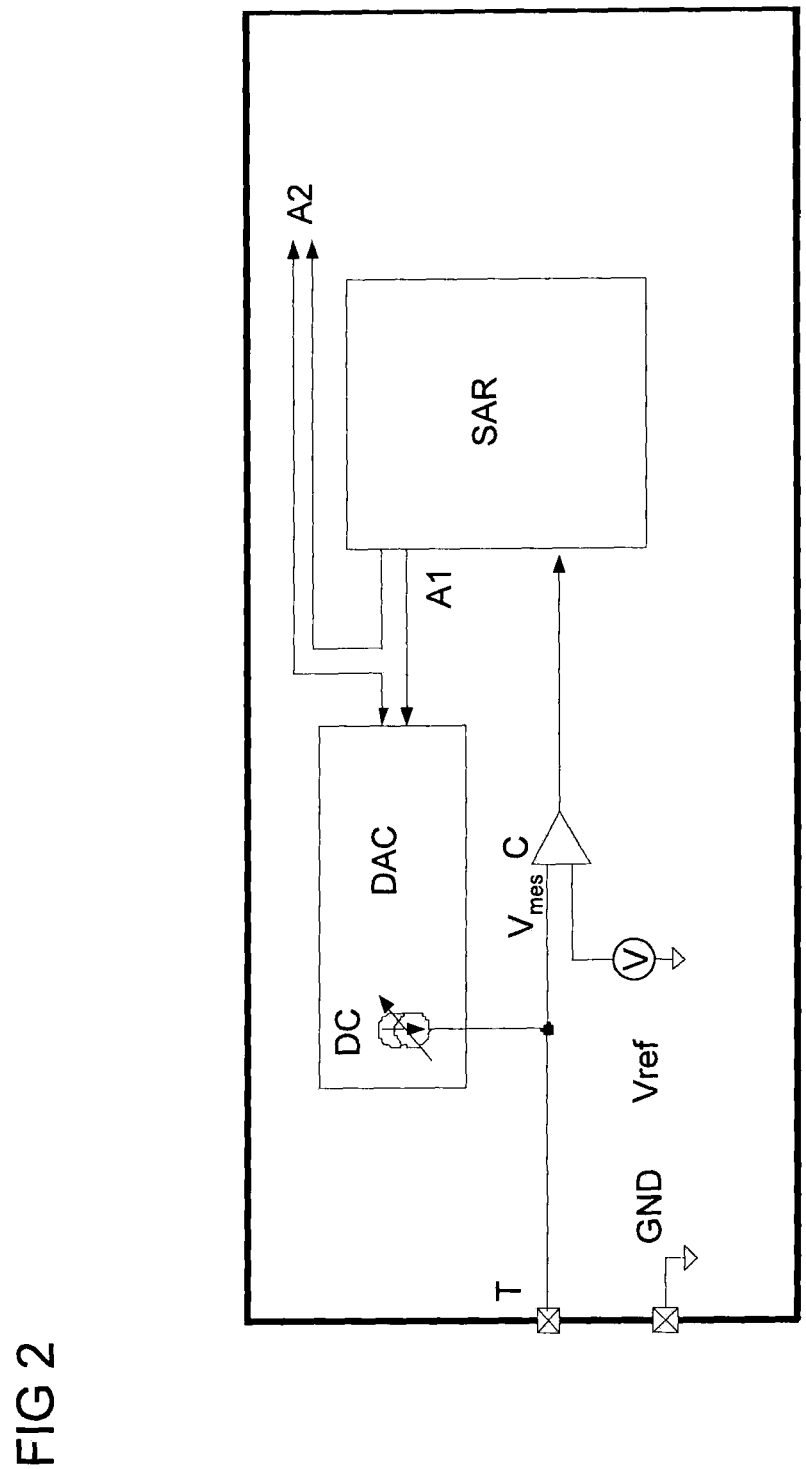
FIG. 2 shows an exemplary embodiment of a circuit arrangement according to the invention with a converter for successive approximation.

FIG. 2 shows an exemplary embodiment of a circuit arrangement according to the invention for temperature measurement, wherein the digitally controllable switching element DS for providing a superposition signal comprises a digitally controllable current source DC and a digital-analog converter DAC. The sequential logic unit SL further comprises a shift register SAR for successive approximation.

The signal dependent on the comparison is approximated by the shift register SAR to a digital signal on output A2 and supplied to the digital-analog converter DAC. Here again the use of a double arrow for output A2 represents a digital signal. The signal dependent on the comparison is superimposed as a current on the temperature-dependent signal in such a manner that the temperature-dependent measurement voltage Vmes is present at the first input of the comparator C. Another comparison and subsequent superposition is iteratively repeated until the temperature-dependent measurement voltage Vmes is equal to the reference voltage Vref.

The temperature can advantageously be determined as a function of the reference voltage Vref from the temperature-dependent measurement voltage Vmes by iterative repetition of comparison and superposition.

Figure 3:
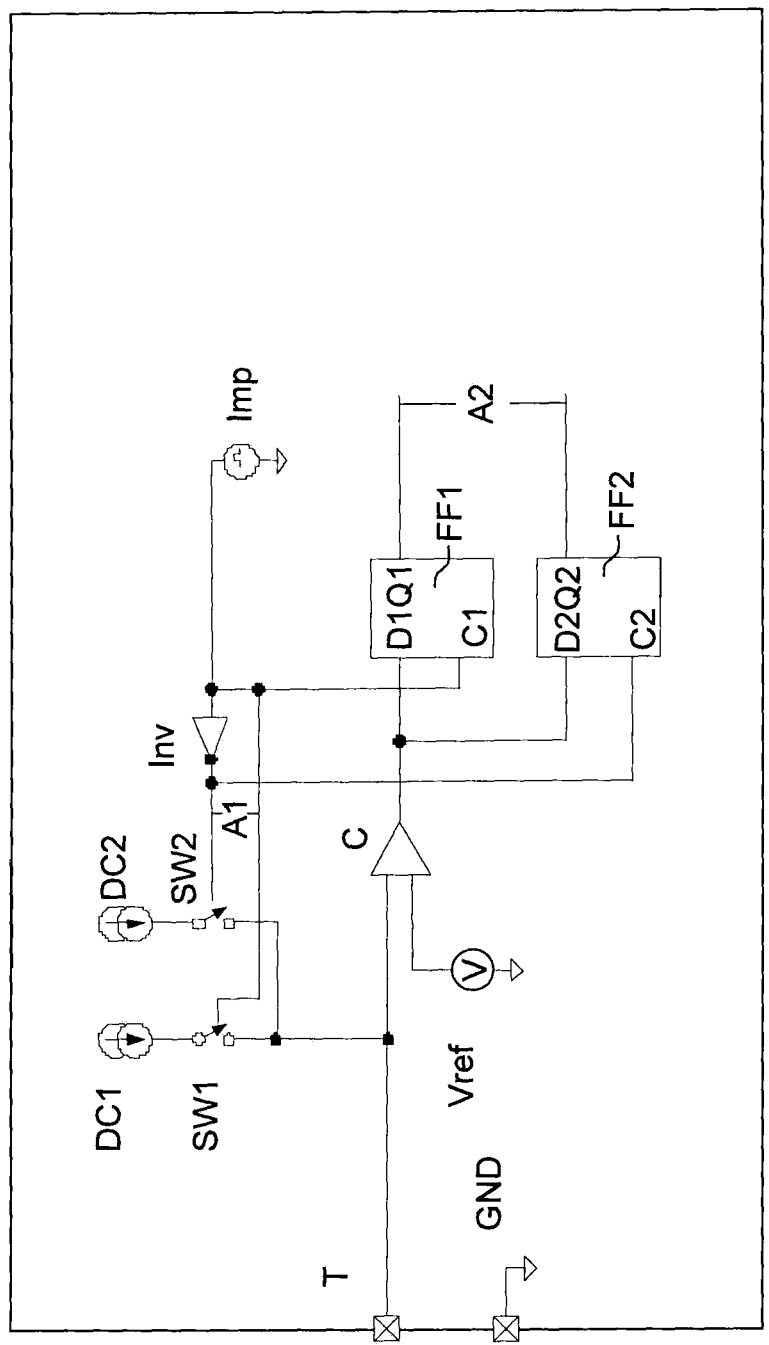
FIG. 3 shows an exemplary embodiment of a circuit arrangement for temperature measurement according to the invention with a pulse generator.

FIG. 3 shows an exemplary embodiment of a circuit arrangement for temperature measurement according to the invention, wherein the digitally controllable switching element DS for providing a superposition signal comprises a first current source DC1 that can be connected via a first digitally controllable switch SW1 to the first input of the comparator C, as well as a second current source DC2 that can be connected via a second digitally controllable switch SW2 to the first input of the comparator C. The sequential logic unit SL comprises a first flip-flop FF1 with a first data input D1 and a second flip-flop FF2 with a second data input D2, each connected to the output of the comparator C. The sequential logic unit SL further comprises a pulse generator Imp that is connected to a first clock input C1 of the first flip-flop FF1 and a second clock input C2 of the second flip-flop FF2. The second output A2 of the sequential logic unit SL comprises a first output Q1 of the first flip-flop FF1 and a second output Q2 of the second flip-flop FF2.

A pulse from the pulse generator Imp sets the first input C1 of the first flip-flop FF1 and closes the first digitally controllable switch SW1, and only the first current source DC1 is connected to the first input of the comparator C. At the same time, the second clock input C2 of the second flip-flop F2 is reset by means of the inverter Inv. In an additional pulse from the pulse generator Imp, the first clock input C1 of the first flip-flop FF1 is reset and the first digitally controllable switch SW1 is opened. At the same time, the second clock input C2 of the second flip-flop FF2 is set and the second digitally controllable switch SW2 closes in such a manner that only the second current source DC2 is connected to the first input of the comparator C. The signal dependent on the comparison is transferred with each clock signal from the pulse generator Imp to the first data input D1 of the first flip-flop FF1 and the second data input D2 of the second flip-flop FF2, and provided at the first output Q1 of the first flip-flop FF1 and the second output Q2 of the second flip-flop FF2.

A temperature interval with an upper and lower temperature limit can advantageously be defined with the first current source DC1 and the second current source DC2. The comparison with two different temperature-dependent measurement voltages, corresponding to the two different temperature limits, takes place at the comparator C with the aid of the pulse generator Imp.

Figure 4:
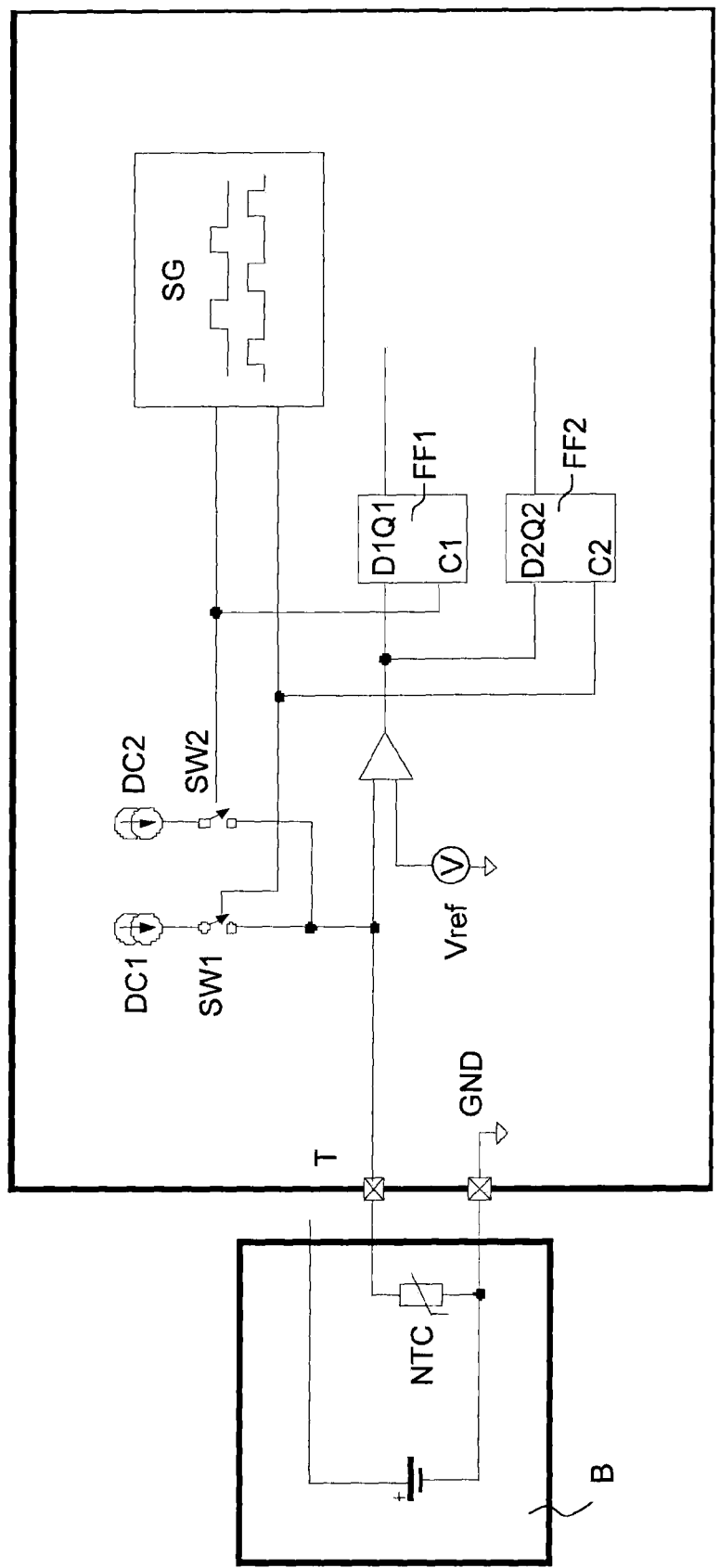
FIG. 4 shows an exemplary embodiment of an arrangement for temperature measurement according to the invention.

FIG. 4 shows an exemplary embodiment of an arrangement for temperature measurement according to the invention that comprises a battery B with a temperature-sensitive element NTC. The circuit arrangement for temperature measurement further comprises a signal generator SG that is connected to the first clock input C1 of the first flip-flop FF1 and the second clock input C2 of the second flip-flop FF2, as well as to the first digitally controllable switch SW1 and the second digitally controllable switch SW2.

The temperature of the battery B is present via the temperature-sensitive element NTC as a temperature-dependent measurement signal at the input for connecting a temperature-sensitive element T to the circuit arrangement for temperature measurement. The temperature is measured by the circuit arrangement for temperature measurement. The signal generator SG generates, in a periodic sequence, a first and a second clock signal that do not overlap.

A temperature interval with an upper and lower temperature limit can advantageously be defined with the first current source DC1 and the second current source DC2. The comparison with two different temperature-dependent measurement voltages, corresponding to the two different temperature limits, takes place at the comparator C with the aid of the signal generator SG.

The invention claimed is:

1. A circuit arrangement for an iterative temperature measurement, comprising:
   a first input for connecting a temperature-sensitive element that produces a measurement voltage dependent on a temperature;
   a comparator with a first input, which is connected to the first input for connecting the temperature-sensitive element and receives the measurement voltage, a second input for feeding a reference voltage, and an output that is connected to a sequential logic unit, the sequential logic unit having a first output and a second output; and
   a digitally controllable switching element for iteratively providing a superposition signal that is connected to the first output of the sequential logic unit and is coupled to the first input of the comparator, the digitally controllable switching element comprising a digital-analog converter, wherein each iteration of the superposition signal produces a successive approximation of the temperature that involves converging the measurement voltage toward the reference voltage.

2. The circuit arrangement according to claim 1, wherein the digitally controllable switching element comprises a digitally controllable current source and/or the reference voltage is controllable.

3. The circuit arrangement according to claim 1, wherein a converter for successive approximation comprises the sequential logic unit and the comparator, wherein the sequential logic unit comprises a shift register for successive approximation, or an up/down converter comprises the sequential logic unit and the comparator, and wherein the sequential logic unit comprises an up/down counter.

4. An arrangement for temperature measurement, comprising a circuit arrangement according to claim 1 that is connected via the input for connecting a temperature-sensitive element to a battery that comprises the a temperature-sensitive element.

5. A circuit arrangement for an iterative temperature measurement, comprising:
   a first input for connecting a temperature-sensitive element;
   a comparator with a first input, which is connected to the input for connecting the temperature-sensitive element, and a second input for feeding a reference voltage and an output that is connected to a sequential logic unit, the sequential logic unit having a first output and a second output; and
   a digitally controllable switching element for iteratively providing a superposition signal that is connected to the first output of the sequential logic unit and is coupled to the first input of the comparator,
   wherein the digitally controllable switching element comprises a first current source and a first digitally controllable switch, and a second current source and a second digitally controllable switch;
   wherein the sequential logic unit comprises a first flip-flop with a first data input and a second flip-flop with a second data input, each connected to the output of the comparator;
   wherein the sequential logic unit further comprises a clock generator that is connected to a first clock input of the first flip-flop and a second clock input of the second flip-flop;
   wherein the clock generator generates a first and a second clock signal in a periodic sequence;
   wherein the first clock signal switches the first digitally controllable switch in such a manner that the first digitally controllable current source is electrically coupled to the first input of the comparator, and the second clock signal switches a second digitally controllable switch in such a manner that the second digitally controllable current source is electrically coupled to the first input of the comparator; and
   wherein the second output of the sequential logic unit comprises a first output of the first flip-flop and a second output of the second flip-flop.

6. The circuit arrangement according to claim 5, wherein the digitally controllable switching element comprises a digitally controllable current source and/or the reference voltage is controllable.

7. The circuit arrangement according to claim 5, wherein:
   the clock generator comprises a pulse generator, as well as an inverter with an input and an output; and
   the first clock signal is present at the input of the pulse generator and second clock signal is present at the output of the pulse generator.

8. The circuit arrangement according to claim 5, wherein the clock generator comprises a signal generator, and the first clock signal and the second clock signal do not overlap.

9. A method for an iterative temperature measurement, comprising:
   supplying a signal dependent on the temperature;
   comparing a temperature-dependent measurement voltage to a reference voltage;
   superimposing a signal dependent on the comparison on the temperature-dependent signal and providing the temperature-dependent measurement voltage;
   iterative repetition of the comparison and the superimposition until an end condition is reached; and
   provision of the signal dependent on the comparison;
   wherein the signal dependent on the comparison is modified in such a manner that after superimposition of the temperature-dependent signal with the signal dependent on the comparison, the temperature-dependent measurement voltage approaches the reference voltage in an approximative manner until the difference of the two signals converges to zero as much as possible, wherein each iteration of the superposition produces a successive approximation of a temperature represented by the temperature-dependent measurement voltage.

10. The method according to claim 9, wherein the reference voltage is adjustable.

11. A method for an iterative temperature measurement, comprising:
   supplying a signal dependent on the temperature;

supplying a first comparison signal and a second comparison signal corresponding to a first and a second temperature limit; and performing a temperature measurement in a first and a second iteration;

wherein, in the first iteration, the first comparison signal is superimposed on the signal dependent on the temperature in order to provide a first temperature-dependent measurement voltage, and the first measurement voltage is compared to the reference voltage; and wherein, in the second iteration, the second comparison signal is superimposed on the signal dependent on the temperature in order to provide a second temperature-dependent measurement voltage, and the second measurement voltage is compared to the reference voltage, wherein the first and the second iterations of the temperature measurement represent successive approximations of the temperature in which a convergence toward the reference voltage occurs between the second iteration relative to the first iteration.

12. The method according to claim 11, wherein the reference voltage is adjustable.

13. The method according to claim 11, wherein the first and the second iteration are repeated iteratively.

14. The method according to claim 11, wherein the first and the second iteration are repeated iteratively until an end condition is reached.

* * * * *